United States Patent [19]

Marancik et al.

[11] 4,073,666
[45] Feb. 14, 1978

[54] METHOD FOR MAKING AN INSULATED SUPERCONDUCTOR AND ARTICLE PRODUCED THEREBY

[75] Inventors: William G. Marancik; Frederick T. Ormand, both of Basking Ridge, N.J.

[73] Assignee: Airco, Inc., Montvale, N.J.

[21] Appl. No.: 721,739

[22] Filed: Sept. 9, 1976

[51] Int. Cl.² .................... H01L 39/00; H01L 39/24
[52] U.S. Cl. ............................... 148/11.5 Q; 29/599; 148/11.5 R
[58] Field of Search .................. 148/11.5 R, 11.5 Q; 29/599; 204/56 R, 32 R

[56] References Cited

U.S. PATENT DOCUMENTS

| 3,205,461 | 9/1965 | Anderson | 333/76 |
| 3,429,032 | 2/1969 | Martin et al. | 29/599 |
| 3,593,413 | 7/1971 | Kafka | 29/599 |
| 3,618,205 | 11/1971 | Barber et al. | 29/599 |
| 3,649,356 | 3/1972 | Mullen et al. | 29/599 |
| 3,676,576 | 7/1972 | Dubernet et al. | 174/113 R |

Primary Examiner—W. Stallard
Attorney, Agent, or Firm—Michael de Angeli; Edmund W. Bopp; Larry R. Cassett

[57] ABSTRACT

A method and article produced thereby are disclosed wherein the method produces a multi-filament superconductor having an insulation capable of withstanding extended heat treatment. According to the invention, a plurality of superconductor forming rods and a plurality of rods or normally conductive material are packed into a can made of a ductile material such as copper and having its interior lined with a valve metal such as tantalum. This assembly is extruded and drawn to a desired size as is known in the art. The ductile metal exterior layer is then removed to expose the valve metal. The exposed valve metal is thereafter oxidized to form an insulating oxide.

4 Claims, 4 Drawing Figures

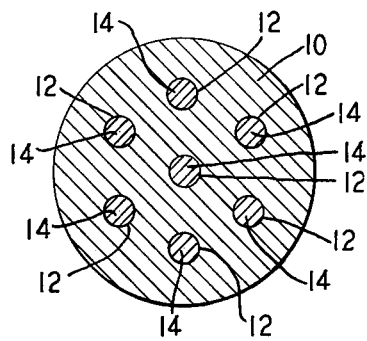
FIG. 1
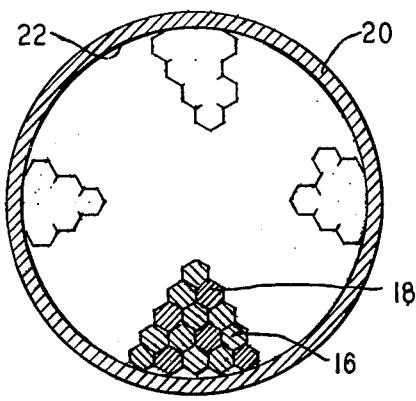
FIG. 2
FIG. 4
```
LINE WALLS OF FINAL EXTRUSION CAN
MADE OF DUCTILE MATERIAL WITH
A VALVE METAL LAYER.
          ↓
PACK CAN WITH SUPERCONDUCTOR
FORMING RODS & RODS OF NORMALLY
CONDUCTIVE MATERIAL.
          ↓
FORM PACKED CAN INTO CONDUCTOR
          ↓
REMOVE LAYER OF DUCTILE MATERIAL
FROM CONDUCTOR SURFACE
TO EXPOSE VALVE METAL LAYER
          ↓
OXIDIZE PART OF VALVE
METAL LAYER
```
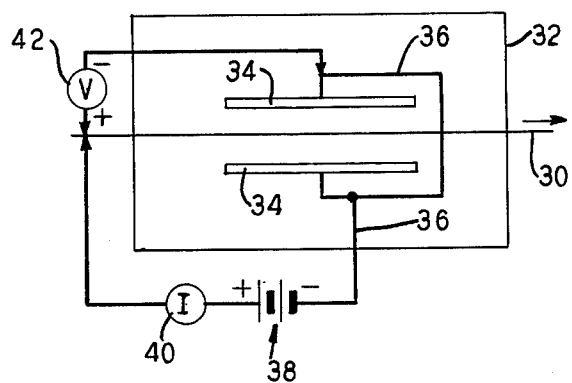
FIG. 3

METHOD FOR MAKING AN INSULATED SUPERCONDUCTOR AND ARTICLE PRODUCED THEREBY

BACKGROUND OF THE INVENTION

The invention relates generally to the field of electrical superconductors and more particularly to a method of manufacturing an insulated superconductor where the superconductive characteristics are formed in situ by prolonged heat treatment.

Many metals and metallic compounds exhibit superconductivity at very low temperatures but only certain of these are suitable for use in high-magnetic field applications such as very powerful generators or accelerators. One material found useful for high field applications in the intermetallic compound $Nb_3Sn$. $Nb_3Sn$ is however very brittle and a conductor containing $Nb_3Sn$ filaments cannot be mechanically worked or even wound into a small radius coil without breaking such filaments.

One approach to solving this problem has been to make flat tape-type conductors in which the $Nb_3Sn$ layer is so thin it can tolerate some amount of bending. The current-carrying capability of these superconductors is low due to the low density of superconducting material.

Another approach to overcoming the problem is to make superconductors with a plurality of fine $Nb_3Sn$ filaments in a matrix material. As is now well known in the art such conductors are made by forming Nb filaments in a CuSn matrix, and after the conductor has been worked to final size, heat treating it to react the Nb and Sn to form in situ filaments of the superconductive intermetallic compound $Nb_3Sn$. This final reactive heat treatment is generally carried out at a temperature of the order of 700° C or more for a period of up to several days.

In many cases it is desirable, if not mandatory, to insulate the conductor before subjecting it to the final reaction heat treatment. This might be done just to avoid the additional handling necessary to insulate it after the in situ formation of the brittle $Nb_3Sn$ phase, or it might be dictated by the fact that the reaction heat treatment is carried out after the conductor is formed into a braid or cable or wound into a magnet coil or other device in which the successive turns must be insulated from one another. Whatever the reason, very few insulating materials that can be applied to the conductor can retain their insulating capability through the high temperatures and long times of the reaction heat treatment.

In view of the foregoing difficulties, it is the principal object of the invention to provide a method for making an insulated superconductor where the insulation can withstand prolonged high-temperature heat treatment.

It is another object of the invention to provide an insulated superconductor capable of withstanding prolonged high-temperature heat treatment.

The invention contemplates lining the inner walls of the final extrusion can of the precursor billet with a layer of a valve metal such as tantalum. The lined can is then filled with a plurality of bars, some of which have the required chemical composition for forming a superconductor such as $Nb_3Sn$ when heat treated, and the others are made of normally conductive material to stabilize the composite superconductor. In some instances, the superconductor bars comprise compositions such as NbTi that need no further treatment.

The filled can is then extruded and drawn until a conductor of the desired size is produced. The ductile material of the can is then removed, preferably by dissolving it in acid such as nitric or sulphuric acid, to expose the underlying layer of valve metal. The conductor is then anodized to oxidize a sufficient amount of the valve metal to form a refractory non-conductive oxide on the conductor. The valve metal oxide is sufficiently durable that it can withstand being formed into a final product as well as withstand the prolonged high-temperature in situ heat treatment required to form the $Nb_3Sn$ filaments within the conductor.

The foregoing and other objects, advantages and features will be described below in greater detail in connection with the drawings wherein:

FIG. 1 is a sectional view of a bronze billet with niobium rods inserted therein;

FIG. 2 is a sectional view of a final extrusion can lined with a valve metal and being partially filled with rods of normally conductive material and rods of superconductor forming material;

FIG. 3 is a schematic illustration of the apparatus for oxidizing the valve metal layer; and FIG. 4 is a flow chart showing the steps of the method of the invention.

DETAILED DESCRIPTION

In the manufacture of an insulated superconductor according to the invention, a superconductor forming rod is made from a bronze billet 10 comprised of a carrier metal such as copper and a reactive metal such as tin. The bronze billet 10 has a plurality of holes 12 drilled or otherwise formed therein and a base metal rod 14 made of a material such as pure niobium is inserted into each hole 12. Due to the fact that bronze with more than about 15% tin by weight is very hard and difficult to extrude or draw, the bronze used in the billet 10 preferably comprises 15 or less percent of tin. Since the amount of tin available in the bronze matrix for high-temperature reaction with the niobium inserted therein is limited, the number of niobium rods that can be usefully inserted into a given bronze billet is controlled by the amount of tin in the billet available for reaction with the niobium in forming $Nb_3Sn$.

The bronze billet 10 and the inserted niobium rods 14 are extruded and drawn, if necessary, to form a superconductor forming rod 16. These superconductor forming rods 16 are preferably worked to have a cross section in the shape of a hexagon which permits dense packing of such rods in a circular extrusion can with only small gaps between the rods and the walls of the can.

A plurality of such superconductor forming rods 16, are packed into a final extrusion can 20 (FIG. 2) which is made of a ductile material such as copper whose inner surface has previously been lined with a layer of valve metal 22 comprised of a metal from the group Ta, Ti, Nb or Hf. The lining of the can may be done by any coating process whereby a layer of valve metal is deposited on the interior walls of the can 20. Alternatively, the valve metal layer 22 may comprise of a tube of Ti, Ta, Nb or Hf inserted into the can 20. Once the can 20 is packed with the desired number of superconductor forming rods 16, it can be extruded and drawn until a composite conductor of the desired diameter is produced having a plurality of filaments made of material derived from the superconductor forming rods 16. The foregoing method of fabrication is now well known in the art. Thereafter the conductor is formed into a stock coil or made into a braid or cable or made into a fabricated product such as an electromagnet. When the stock coil or device made therefrom is subjected to a prolonged high temperature, the constituents of the conductor react in situ to form filaments of superconducting intermetallic compound such as $Nb_3Sn$.

As mentioned above, the final extrusion can 20 is made of a ductile material such as copper and lined with a layer of valve metal 22. As will be described later in greater detail, the material of the can 20 is removed from the conductor after it has been extruded and drawn to thereby expose the underlying layer of valve metal 22 which is later oxidized to form a non-conductive valve metal oxide for insulating the conductor. The can 20, however, is needed because valve metals are very difficult the extrude and draw and are not suitable themselves as the extrusion for the bundle of rods. By surrounding the bundle with the valve metal overlaid with a layer of ductile material (the can 20), it can be extruded and drawn. Thereafter, the ductile material of the can is removed to expose the valve metal layer.

It is known that superconductors employing filaments of intermetallic compounds such as $Nb_3Sn$ are stabilized by placing the superconducting filaments in close proximity to normally conductive material such as copper.

For superconductors made as described above from superconductor forming rods 16 having a bronze matrix with niobium filaments, normally conductive material in close proximity to the superconductor forming rods 16 is easily provided by packing the final extrusion can 20 with a plurality of rods 18 made of a normally conductive material such as copper. A barrier layer is utilized to separate the high conductivity Cu rods 18 from the bronze matrix rods 16 containing the Nb filaments. After the extrusion can 20 has been extruded and drawn to size, the composite conductor has a plurality of niobium filaments each disposed in a bronze matrix. In addition, there may be included an effective cross sectional area of high conductivity copper.

An alternative approach to making a superconductor according to the invention is to form the superconductor forming rods from a matrix of niobium with at least one filament of bronze embedded therein. When such a rod is heat treated, $Nb_3Sn$ forms along the interface between the bronze and niobium. Advantageously, if the niobium layer is thick enough, the tin from the bronze will not migrate therethrough during heat treating. As such, rods of this type can be packed directly into a final extrusion can 20 as described above with rods 18 of normally conductive material and neither the alternative superconductor forming rods nor the rods 18 of normally conductive material need be coated with a barrier layer as the niobium of the alternate superconductor forming rods, when sufficiently thick, serves as the barrier as well as providing one of the consitituents of the superconductive material.

Once a composite conductor is made as described above, it is then passed through an acid solution, such as nitric or sulphuric acid, to chemically remove the outer layer of ductile material of the can, thereby exposing the underlying layer of valve metal. The wire is then anodized to oxidize the valve metal. The anodizing is preferably accomplished by passing the wire 30 (FIG. 3) into a tank 32 which contains a weak organic acid such as citric or oxalic acid. Disposed within the tank 32 are two conducting metal plates 34 which are electrically connected by a conductor 36 to each other and to the negative terminal of a direct current power source 38. The positive terminal of the power source 38 connects via a current meter 40 to the wire 30. When the level of the organic acid in the tank 32 is high enough to contact both the plates 34 and the wire 30, a circuit is formed from the positive terminal to the negative terminal of the power source 38 via the meter 40, the wire 30, the plates 34, and the conductor 36. The voltage of the power source 38 is measured by a volt meter 42 which is connected between the wire 30 and one of the plates 34.

Typically, during anodizing of the wire 30, the voltage of the power source 38, as measured by the volt meter 42, is about 350 volts and the current which passes through the wire 30 causes the valve metal to oxidize. The wire, after passing through the tank 32 once, either passes through the tank 32 again or through another tank operative like tank 32. The second pass through the weak organic acid gives rise to a lower current or substantially zero current when the voltage at the plates 34 is about 300 volts provided that a sufficient percentage of the valve metal is oxidized during the first pass through tank 32. If only the exposed surface layer of Ta is oxidized, there is the possibility that during heat treatment of the superconductor oxygen will migrate from the oxidized layer into the unoxidized remainder producing conductive suboxides. It has been found for conductors of the type described above having tantalum as the valve metal that at least about 10% of the tantalum need be oxidized to $Ta_2O_5$ to assure that the conductor remains well insulated through the subsequent reaction heat treatment.

Once a valve metal oxide layer of sufficient thickness is produced, as described above, the conductor is ready to be formed into a stock coil, a braid or cable, or an assembled product such as an electromagnet. Thereafter, the coil or assembled product is subjected to extended heat treatment to cause Sn to migrate from the bronze into the Nb and react therewith to form the intermetallic compound $Nb_3Sn$. The barrier material between the bronze and the pure copper prevents migration of tin into the pure copper portion of the conductor.

FIG. 4 summarizes the method of making a superconductor according to the invention. Assuming that rods of superconductor forming material and rods of normally conductive material are available, the first step comprises lining the inside walls of a final extrusion can made of a ductile material with a layer of valve metal. The valve metal consists of one of the group Ta, Ti, Nb, Hf. This can be done by coating the interior of the can walls with valve metal or more simply by inserting the tube or can of valve metal within the Cu can.

The second step comprises packing the can with a plurality of superconductor forming rods and, if added stability is required, with a plurality of rods made of a normally conductive material such as copper. For the embodiment shown, the superconductor forming rods comprise filaments of niobium in a bronze matrix. However, as the term superconductor forming rods is used herein, the superconductor forming rod can comprise a material exhibiting superconductive properties without further reaction such as NbTi in a matrix of copper. Alternatively, the superconductor forming material may comprise a gallium-copper matrix with vanadium filaments which is made superconductive by subsequent heat treatment. Other superconductor forming rods may be used as well.

The third step of the process involves mechanically forming a conductor from the packed final extrusion can. This is accomplished by extruding and drawing the can to form a composite conductor of the desired cross section. The extrusion and drawing may have to be done at an elevated temperature; however, it should be done at a low enough temperature to avoid solid state reaction between the reactive metal and the base metal in the superconductor forming rods.

The fourth step involves removing the ductile material of the can from the conductor surface. This is done preferably by passing the conductor through an acid to chemically remove the ductile material.

The fifth step of the process is to oxidize the valve metal layer which is exposed after the ductile material is removed. The preferred approach is to anodize the wire in a weak organic acid. The wire is anodized until sufficient valve metal oxide is formed to provide a good insulation for the wire which will also withstand reaction heat treatment (if the superconductor is of the type requiring in situ heat treatment) without degradation of its insulating properties.

As already indicated, some superconductors such as $Nb_3Sn$ are very brittle and cannot be bent without breaking. The invention contemplates overcoming the problem by first forming the insulated conductor made according to the inventive process described above into a product. Thereafter, the product is heat treated to form superconducting filaments within the insulated conductor. Since the valve metal oxide formed on the conductor surface in accordance with the invention is not affected by such heat treatment, successive turns of coiled conductor remain insulated from one another even after heat treatment.

The foregoing discussion clearly points out the advantages of the method according to the invention when applied to making insulated superconductors where the superconducting property of the conductor is produced by prolonged reaction heat treatment. As mentioned briefly above, however, the method according to the invention need not be limited to making insulated superconductors where such reaction heat treatment is required but may also be used for making insulated superconductors which do not require heat treatment to form the superconducting material. For example, the described superconductor forming rods, one example being bronze/niobium rods, can be replaced by rods formed of a copper matrix with niobium titanium filaments. Niobium titanium filaments comprise a known superconductor that can be extruded and drawn. The latter-mentioned rods can be used in place of the above-described forming rods in the process shown in FIG. 4. Since the latter-mentioned rods exhibit superconductive properties at cryogenic temperatures without further reaction, the process of the invention need not include heat treatment when such rods are used to form the conductor. Also, rods of normally conductive material need not be put in the final extrusion can because these superconductors have Nb/Ti filaments in a matrix of copper which is stable, making further stabilizing unnecessary.

The foregoing description has been made with emphasis on a particular known process for producing a $Nb_3Sn$ filament superconductor; however, those skilled in the superconductor art will understand that the invention need not be limited to that particular process. Indeed, the invention may be used with $Nb_3Sn$ and like superconductors forming rods produced by other processes. The invention may also be used with other superconductor forming rods of the type requiring heat treatment to form the superconducting material. The invention may also be used with rods containing superconductive material that do not require heat treatment yet can be extruded, drawn, and bent without breaking. Numerous other variations and equivalent alternatives to the invention may be conceived by those skilled in the art; however, it should be recognized that the above description discloses a preferred embodiment and it should not be construed as limiting the claimed invention.

We claim:

1. A method for manufacturing an insulated composite conductor comprising the steps of:
    a. lining the inner walls of an extrusion can made of a ductile material with a layer of valve metal selected from the group consisting of Ti, Nb, Hf and Ta;
    b. packing a plurality of superconductor forming rods made of superconductor forming material into the extrusion can;
    c. mechanically forming a composite conductor from the packed can wherein the conductor has filaments of superconductor forming material;
    d. removing the ductile material layer of the can from the surface of the composite conductor to expose the underlying layer of valve metal;
    e. oxidizing at least part of the exposed layer thereon; and
    f. heat treating the product to react components of the superconductor forming rods to form, in situ, filaments of material selected from the group consisting of $Nb_3Sn$ and $V_3Ga$ having superconductive properties at cryogenic temperatures.

2. The method of claim 1 in which the valve metal layer is oxidized by anodizing to at least 10% of its depth.

3. In a multifilament superconductor of the type in which metallic components are reacted by heat treatment to form in situ filaments of an intermetallic compound exhibiting superconductive properties at cryogenic temperatures, the improvement which comprises insulating the exterior of the conductor with a refractory metal oxide, selected from the group consisting of $Ta_2O_5$, $Nb_2O_5$, $HfO_2$ and $TiO_2$, that retains its electrically insulating properties through the reaction heat treatment.

4. A conductor according to claim 3 wherein the intermetallic compound is selected from the group consisting of $Nb_3Sn$ and $V_3G$.

* * * * *

UNITED STATES PATENT AND TRADEMARK OFFICE
CERTIFICATE OF CORRECTION

PATENT NO. : 4,073,666
DATED : February 14, 1978
INVENTOR(S) : Marancik, W.G.; Ormand, F.T.

It is certified that error appears in the above-identified patent and that said Letters Patent are hereby corrected as shown below:

In the "ABSTRACT", line 6, "or" should read -- of --.

Column 1, line 17, "in" should read -- is --.

Column 2, line 63, "of" should be deleted (first occurrence).

Column 3, line 19, "the" should read -- to --.
line 20, after "extrusion" and before "for" the word -- envelope -- should be inserted.

Column 5, line 55, after "above-described" and before "forming" the word -- superconductor -- should be inserted.

Column 6, line 10, "superconductors" should read -- superconductor --.

line 38, after "layer" and before "thereon" insert -- of valve metal to form an electrically insulating layer --.

line 60, "$V_3G$" should read -- $V_3Ga$ --.

Signed and Sealed this

Twentieth Day of June 1978

[SEAL]

Attest:

RUTH C. MASON
Attesting Officer

DONALD W. BANNER
Commissioner of Patents and Trademarks